United States Patent
Hayashi

(10) Patent No.: US 7,619,179 B2
(45) Date of Patent: Nov. 17, 2009

(54) ELECTRODE FOR GENERATING PLASMA AND PLASMA PROCESSING APPARATUS USING SAME

(75) Inventor: Daisuke Hayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 231 days.

(21) Appl. No.: 11/565,179

(22) Filed: Nov. 30, 2006

(65) Prior Publication Data

US 2007/0170156 A1    Jul. 26, 2007

Related U.S. Application Data

(60) Provisional application No. 60/771,446, filed on Feb. 9, 2006.

(30) Foreign Application Priority Data

Jan. 20, 2006    (JP) .............................. 2006-013119

(51) Int. Cl.
    *B23K 10/00*    (2006.01)
(52) U.S. Cl. ............................. 219/121.52; 219/121.43; 156/345.47; 118/723 L; 216/71
(58) Field of Classification Search .............. 219/121.4, 219/121.43, 121.41; 156/345.34, 345.47; 118/723 L, 723 R; 216/71
    See application file for complete search history.

(56) References Cited

U.S. PATENT DOCUMENTS

| | | | | | |
|---|---|---|---|---|---|
| 4,534,816 | A | * | 8/1985 | Chen et al. | 156/345.37 |
| 4,612,077 | A | * | 9/1986 | Tracy et al. | 156/345.34 |
| 5,074,456 | A | * | 12/1991 | Degner et al. | 228/121 |
| 2005/0211384 | A1 | | 9/2005 | Hayashi | |

FOREIGN PATENT DOCUMENTS

| | | |
|---|---|---|
| JP | 2001-217362 | 8/2001 |
| JP | 2005-228973 | 8/2005 |

* cited by examiner

*Primary Examiner*—Mark H Paschall
(74) *Attorney, Agent, or Firm*—Oblon, Spivak, McClelland, Maier & Neustadt, P.C.

(57) ABSTRACT

In an electrode for generating a plasma, disposed to face a surface of a substrate to perform a plasma processing on the surface of the substrate, the electrode includes a metal-based composite material formed by impregnating a metal into a base member made of a porous ceramic, and having a joint surface at least facing toward the entire surface of the substrate. The electrode also includes a conductive plate made of a plasma-resistant material melt-bonded by a metal to the joint surface of the metal-based composite material.

11 Claims, 8 Drawing Sheets

MOLTEN METAL

FIG.7

| | | GAS HOLE FORMATION METHOD | | | | | | | | | | | |
|---|---|---|---|---|---|---|---|---|---|---|---|---|---|
| | | A | | | | B | | C | | | | | |
| ROD MEMBER (SLEEVE) 85 | Y₂O₃ | | | | | | | ○ | ○ | ○ | | | |
| | Al₂O₃ | | | | | | | | | | | | |
| | SiC | | | | | | | | | | ○ | ○ | ○ |
| | SiO₂ | | | | | | | | | | | | |
| | SiN | | | | | | | | | | | | |
| | AlN | | | | | | | | | | | | |
| BASE MEMBER 9 | SiC | ○ | ○ | | | ○ | | ○ | | | ○ | | |
| | SiN | | | ○ | ○ | | ○ | | | | | | |
| | Al₂O₃ | | | | | | | | ○ | | | ○ | |
| | AlN | | | | | | | | | ○ | | | ○ |
| CONDUCTIVE PLATE 82 | Si | | ○ | | ○ | | | | | | | | |
| | SiC | ○ | | ○ | | ○ | ○ | ○ | ○ | ○ | ○ | ○ | ○ |
| MOLTEN METAL | Si | ○ | | ○ | | ○ | ○ | ○ | ○ | ○ | ○ | ○ | ○ |
| | Al | | ○ | | ○ | | | | | | | | |
| COMBINATION IN UPPER ELECTRODE 7 | | P1 | P2 | P3 | P4 | P5 | P6 | P7 | P8 | P9 | P10 | P11 | P12 |

ELECTRODE FOR GENERATING PLASMA AND PLASMA PROCESSING APPARATUS USING SAME

FIELD OF THE INVENTION

The present invention relates to an electrode for generating a plasma, disposed to face a substrate being plasma-processed; and a plasma processing apparatus using the electrode.

BACKGROUND OF THE INVENTION

A plasma processing using plasma has been widely employed in a manufacturing process of semiconductors, liquid crystal devices, and the like. As shown in FIG. 8, the plasma processing apparatus for performing such a plasma processing includes, in a processing vessel 10 made of vacuum chamber, a mounting table 11 serving as a lower electrode for mounting thereon a substrate, e.g., a semiconductor wafer W; and a shower head 12 disposed above the mounting table 11 and provided with a number of gas supply holes 12A. An upper electrode 13 is provided on a lower surface of the shower head 12. In the plasma processing apparatus having the above configuration, by applying a plasma generation high frequency power to either one of the upper electrode 13 and the mounting table 11, e.g., to mounting table 11, with a high frequency power supply 14, a plasma is generated in a processing space between the mounting table 11 and the upper electrode 13, and the processing gas introduced into the processing vessel 10 through the shower head 12 is activated by the plasma, so as to perform a plasma processing, e.g., an etching or a film forming process, on the wafer W. Further, the high frequency power from the plasma in the processing space reaches the upper electrode 13 and flows therefrom to the ground via a wall portion of the processing vessel 10. In FIG. 8, reference numeral 17 is a gas exhaust path through which the atmosphere in the processing vessel 10 is exhausted to outside.

The upper electrode 13 is constructed with a metal base (base member) 15 such as aluminum (Al), stainless steel (SUS) or the like; and a conductive plate 16 such as a silicon (Si) plate, a silicon carbide (SiC) plate or the like, wherein the conductive plate 16 tightly fixed on the surface of the metal base by screws, clamps or the like. By adopting such configuration, the entire structure of the upper electrode 13 is prevented form being deformed by a stress exerted thereon by the depressurized atmosphere inside processing vessel 10; and parts of the upper electrode 13 exposed to the plasma can be of a structure having tolerance to plasma to prevent metal contamination.

The upper electrode 13 is heated to a high temperature by the plasma generated in the processing space. Since, however, Si or SiC has a thermal expansion coefficient (linear expansion coefficient) that is smaller than that of the metal base 15, a dimensional difference is produced therebetween when the upper electrode 13 is heated. As a result, an excessive tensile stress is exerted to a fixed portion of the conductive plate 16, which often results in a destruction of the conductive plate 16.

In order to solve the problem, it has been attempted to prevent a tensile stress from being applied to the conductive plate 16 by the thermal expansion of the metal base 15 by movably fixing the conductive plate 16 to the metal base 15 by means of screws or clamps, in consideration of the dimensional difference that would be produced therebetween due to thermal expansion.

However, in order to perform a plasma processing uniformly throughout on the entire surface of the wafer W, the concentration of plasma active species needs to be consistent throughout a plane parallel to the wafer W. To obtain the consistency, an electric and thermal state of the conductive plate 16 exposed to the plasma needs to be consistent throughout the entire surface thereof. Accordingly, the conductive plate 16 and the metal base 15 are required to be contacted to each other in a manner that an electric and thermal conduction and a heat transfer can be uniformly carried out through the entire contact surfaces thereof. In other words, the two components need to be connected while preserving a highly uniform in-plane contact state. In many cases, however, only peripherial portions of the conductive plate 16 are fixed to a metal base 15. Thus, in case of movably fixing the conductive plate 16, local irregularities occur in the upper electrode 13 in terms of the contact state between the metal base 15 and the conductive plate 16. As a result, it becomes difficult to obtain a high in-plane uniformity in the electric and thermal conduction between the metal base 15 and the conductive plate 16. Thus, it is very likely that the conductive plate 16 is subject to a breakage, a disordered process, an abnormal discharge or the like. Furthermore, the contact surfaces of the metal base 15 and the conductive plate 16 would be rubbed against each other due to a dimensional variation caused by a thermal expansion and contraction during a temperature increase and decrease cycle. Therefore, dusts could be generated at the gas discharge openings 12a.

In the meanwhile, Patent Reference 1 discloses an upper electrode including a metal base and a dielectric, wherein the electrode is fabricated by cutting a central portion of a porous ceramic to have a vertical cross section of a trapezoid shape; when viewed from a longitudinal cross section, fitting the dielectric into the cutout portion; and then impregnating a metal into the porous ceramic to form the metal base. While the metal is impregnated, the metal base and the dielectric are joined to each other by the impregnated metal. According to this technique, a high frequency power at a central portion of the electrode can be reduced by the presence of the dielectric inside the central portion of a metal-ceramic composite material, so that the strength of an electric field can be made uniformly. However, Reference 1 is mute on how to connect the metal base and the conductive plate to obtain a uniform in-plane contact state in which a uniform electric and thermal conduction can be carried out therebetween.

Patent Reference 1: Japanese Patent Laid-open Application No. 2005-228973 (paragraphs 0032 and 0053-0055 and FIG. 9)

SUMMARY OF THE INVENTION

It is, therefore, an object of the present invention to provide an electrode, for generating a plasma, disposed to face a substrate and formed of a metal base (metal-based composite material in the present invention) and a conductive plate; and a plasma processing apparatus using the electrode, wherein the conductive plate can be prevented from damaging, and the metal base and the conductive plate can be maintained in a contact state where their in-plane uniformity for electrical and thermal conduction is kept high.

In accordance with the present invention, an electrode for generating a plasma, disposed to face a surface of a substrate to perform a plasma processing on the surface of the substrate, the electrode comprising: a metal-based composite material formed by impregnating a metal into a base member made of a porous ceramic, and having a joint surface at least facing toward the entire surface of the substrate; and a conductive plate made of a plasma-resistant material melt-bonded by a metal to the joint surface of the metal-based composite material. In the electrode, the base member is made of silicon carbide, silicon nitride, alumina or aluminum nitride, the metal used in a melt-bonding process is silicon or aluminum and the conductive plate is made of silicon or silicon carbide. A preferable configuration of an electrode for plasma generation of the above is following: the base member is silicon carbide; the metal used in the melt-bonding process is silicon; and the conductive plate is made of silicon carbide. Further, it is preferable that the conductive plate is made of CVD-silicon carbide. Further, the CVD-silicon carbide is a material that a powder-shaped or bulk-shaped SiC is vaporized and deposited. Further, in the electrode for plasma generation described above, the conductive plate is melt-bonded to the metal-based composite material by the metal while the metal is impregnated into the base member.

Further, in the electrode for plasma generation, it is preferable that gas discharge openings for discharging a processing gas into a processing atmosphere for the substrate be implemented by sleeves provided through the metal-based composite material and the conductive plate, and boundaries between the metal-based composite material, the sleeves and the conductive plate are melt-bonded by the metal. In this case, it is preferable that the boundaries between the metal-based composite material, the sleeves and the conductive plate be melt-bonded by the metal while the metal is impregnated into the base member. Further, the sleeves are made of silicon carbide or yttrium oxide.

Further, in the plasma processing apparatus of this invention, in accordance with still another aspect of the present invention, a plasma processing apparatus for processing a substrate by using a plasma including: a hermetical processing vessel; a supporting table disposed in the processing vessel and serving as an electrode member for supporting the substrate thereon; a processing gas supply unit for supplying a processing gas into the processing vessel; and a plasma generating unit for converting the processing gas into the plasma by forming a high frequency electric field between the mounting table and the electrode facing the mounting table. Further, in the plasma processing apparatus described above, the processing gas introduction unit includes a shower head for injecting a gas through a plurality of openings; the electrode serves as a shower plate of the lower surface of the shower head and a plurality of gas discharge openings are formed therethrough.

In the present invention, the metal base is formed of the metal-based composite material obtained by impregnating a metal into the base member made of a porous ceramic, and the electrode for plasma generation is configured by melt-bonding the metal based-composite material to the conductive plate formed of plasma resistant material. Accordingly, the metal-based composite material and the conductive plate can be bonded uniformly at a joint surface. Thus, a generation of an excessive local stress due to a dimensional difference of thermal expansion can be prevented, so there is a low possibility of the conductive plate being destroyed.

Also, since the joint surface between the metal-based composite material and the conductive plate is filled with the molten metal, an electric conducting and a heat transfer can be performed effectively and uniformly on the entire joint surface, whereby an occurrence of object variation of an electrode can be prevented. As a result, a plasma having a high uniformity in a plane parallel to the wafer W can be generated, so that a plasma processing can be performed on the entire surface of the substrate uniformly. Besides, since there exists no mechanical contact portion (friction portion) between the metal-based composite material and the conductive plate, no friction occurs therebetween due to a thermal expansion and contraction, so that a generation of a stress can be suppressed.

Moreover, by using SiC as respective materials of porous ceramic base member and the conductive plate, and by using silicon as the molten metal, a difference in linear expansion coefficients of the metal-based composite material and the conductive plate can be reduced almost close to zero on the joint surface therebetween (Since there exists a difference in linear expansion coefficients of SiC and silicon therebetween, it can not become zero) As a consequence, a destroy of the conductive plate can be prevented securely.

BRIEF DESCRIPTION OF THE DRAWINGS

The above and other objects and features of the present invention will become apparent from the following description of preferred embodiments, given in conjunction with the accompanying drawings, in which:

FIG. 7 is a table describing combinations of materials for a rod member, a base member, a conductive plate and a molten metal for forming the upper electrode of the apparatus shown in FIG. 1.

DETAILED DESCRIPTION OF THE EMBODIMENTS

Figure 1:
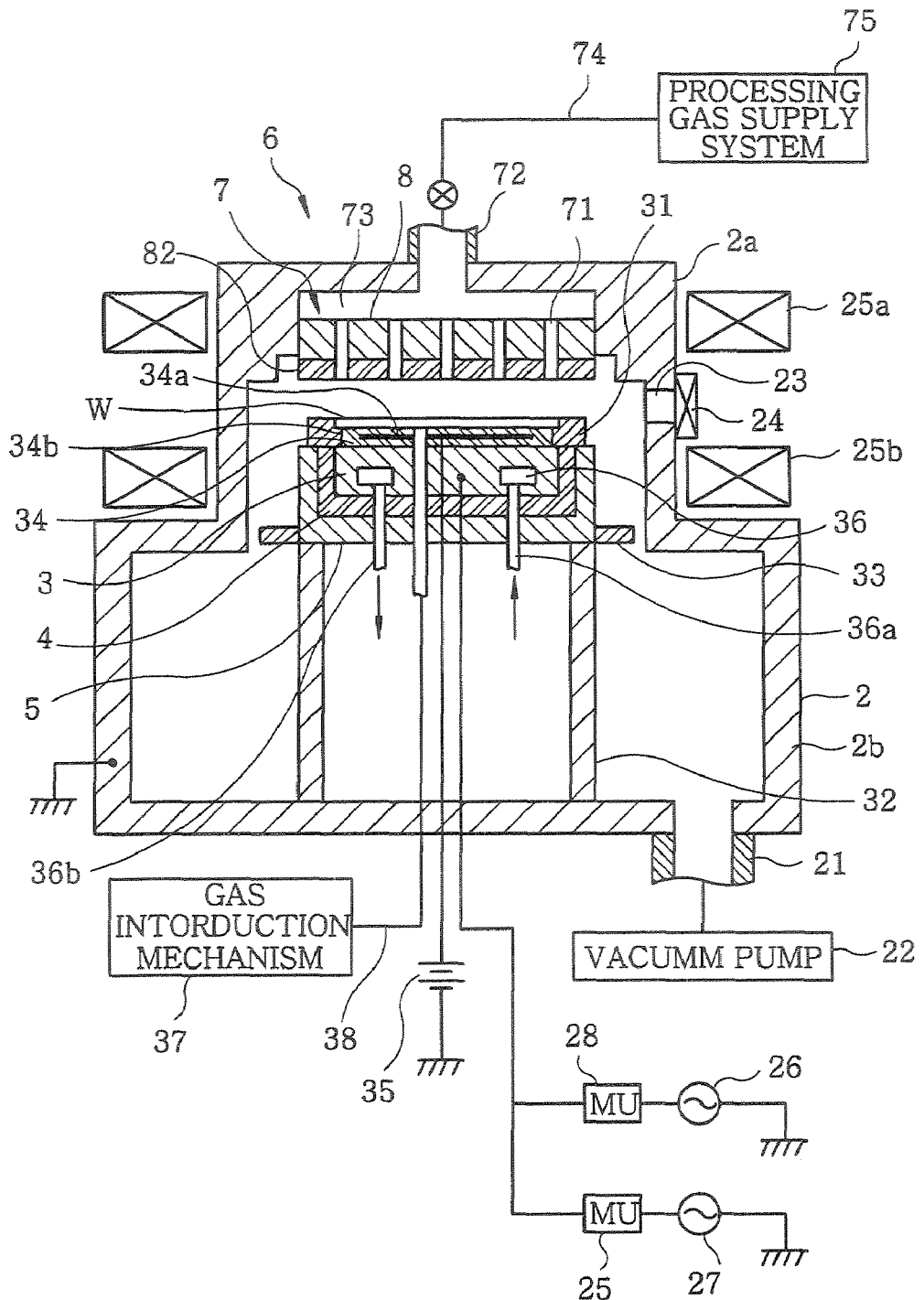
FIG. 1 is a cross sectional view of an RIE (Reactive Ion Etching) plasma etching apparatus employing an electrode in accordance with a first preferred embodiment of the present invention as an upper electrode.

Hereinafter, embodiments of the present invention will be described. FIG. 1 is a cross sectional view of an RIE (Reactive Ion Etching) plasma etching apparatus in which an electrode in accordance with a first preferred embodiment of the present invention is employed as an upper electrode. Referring to FIG. 1, a processing vessel (vacuum chamber) 2 made of, e.g., aluminum is configured with a cylindrical upper portion 2A having a smaller diameter and a cylindrical lower portion 2B having a larger diameter. Further, the processing vessel 2 is hermetically sealed. Installed in the processing vessel 2 is a supporting table 3 for horizontally supporting thereon a semiconductor wafer W, which is a substrate to be processed. The supporting table 3 also functions as a lower electrode, and it is formed of, for example, aluminum and is supported by a conductive support 5 via an insulator 4. Furthermore, a focus ring 31 formed of, for example, silicon is mounted on a periphery of the top surface of the supporting table 3, and a portion below the support 5 is covered by a cover 32. Also, a baffle plate 33 is installed around the support 5, and the baffle plate 33 is electrically connected to the processing vessel 2 via the support 5 and the cover 32. The processing vessel 2 is grounded.

A shower head 6 serving as a gas supply unit for introducing a processing gas into the processing vessel 2 is disposed at a ceiling portion of the processing vessel 2. Further, formed at the lower surface of the shower head 6 is an upper electrode 7 serving as a shower plate. The upper electrode 7 is installed by facing the supporting table 3, which functions as the lower electrode, in a parallel manner, and the upper electrode 7 is provided with a plurality of gas discharge openings 71 formed therethrough. That is, the upper electrode 7 and the supporting table 3 serving as the lower electrode together form a pair of parallel plate electrodes. In addition, the upper electrode 7 is grounded via the processing vessel 2.

A gas exhaust port 21 is formed at a bottom portion of the lower portion 2b of the processing vessel 2, and a vacuum pump 22 is connected to the gas exhaust port 21. By operating the vacuum pump 22, the processing vessel 2 is depressurized to a predetermined vacuum level. Further, a loading/unloading port 23, through which the wafer W is loaded into or unloaded from the processing vessel 2, is provided at a sidewall of the upper portion 2a of the processing vessel 2. In addition, the loading/uploading port 23 is opened and closed by a gate valve 24.

A first high frequency power supply 26 for generating a plasma and a second high frequency power supply 27 for attracting ions are connected to the supporting table 3 via matching units (MUs) 28 and 25, respectively. The first and the second high frequency power supply 26 and 27 apply high frequency powers with predetermined frequencies to the supporting table 3. Here, the frequency of the second high frequency power supply 27 is set to be lower than that of the first high frequency power supply 26.

An electrostatic chuck 34 for electrostatically adsorbing and holding the wafer W thereon is provided on the top surface of the supporting table 3. The electrostatic chuck 34 has an electrode 34a embedded in an insulator 34b, wherein the electrode 34a is connected to a DC power supply 35. By applying a voltage to the electrode 34a with the DC power supply 35, the wafer W is adsorbed and held by the electrostatic force, e.g., a Coulomb force.

A coolant chamber 36 is disposed inside the supporting table 3. A coolant is introduced into the coolant chamber 36 via a coolant introducing line 36a and discharged via a coolant discharge line 36b. By circulating the coolant in the coolant chamber 36, a cold heat is transferred to the wafer W via the supporting table 3, whereby a processing surface of the wafer W is maintained at a desired temperature.

Further, a cooling gas is introduced between the top surface of the electrostatic chuck 34 and the backside surface of the wafer W with a gas introduction mechanism 37 via a gas supply line 38 in order to facilitate the cooling of the wafer W by the coolant being circulated through the coolant chamber 36, even when the processing vessel 2 is pumped by the vacuum pump 22 and maintained in a vacuum state. By introducing the cooling gas, the cold heat is transferred efficiently to the wafer W, thereby enhancing the cooling efficiency of the wafer W.

The shower head 6 includes a gas inlet port 72 at an upper portion thereof, a hollow space 73 therein for allowing the processing gas to be diffused therethrough. One end of the gas supply line 74 is connected to the gas inlet 72, and the other end thereof is coupled to a processing gas supply system 75 for supplying the processing gas.

Further, multi-pole ring magnets 25a and 25b are disposed around the periphery of the upper portion 2a of the processing vessel 2 such that the loading/unloading port 23 is interposed between the multi-pole ring magnets 25a and 25b. Each of the multi-pole ring magnets 25a, 25b has a plurality of columnar anisotropic segment magnets installed to a casing of a ring-shaped magnetic body. In addition, the neighboring multiple columnar segment magnets are arranged in directions opposite to each other, whereby magnetic force lines are formed between the adjacent segment magnets. Thus, a magnetic field is formed only at a peripheral portion of a processing space between the upper and lower electrodes, thereby confining the plasma within the processing space.

Figure 2:
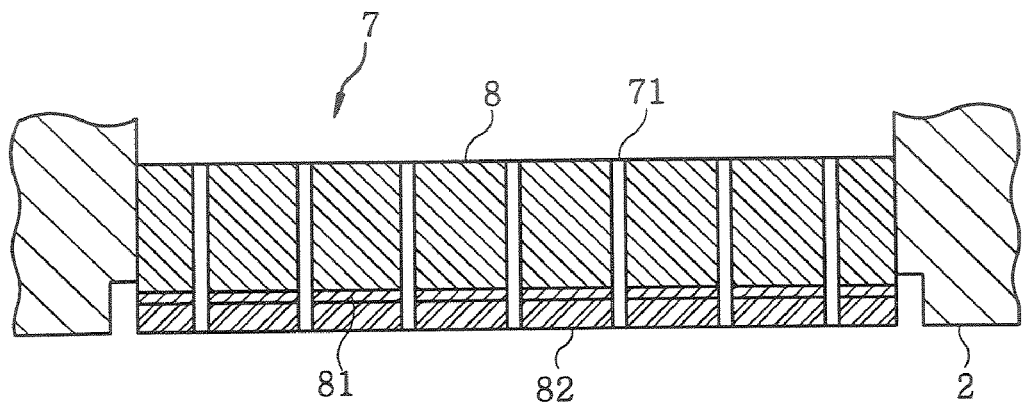
FIG. 2 shows an enlarged cross sectional view of the upper electrode of the apparatus shown in FIG. 1.

Hereinafter, a configuration of the upper electrode 7 will be described in detail. As shown in FIG. 2 showing an enlarged cross sectional view of the upper electrode 7, the upper electrode 7 includes a metal-based composite material 8, which is formed by impregnating a metal into a columnar base member made of a porous ceramic; and a circular conductive plate 82 abutted to the lower surface of the metal-based composite material 8 via a joint layer 81. Since the upper electrode 7 is a component for generating electric force lines to convert a processing gas into a plasma, the size of the joint surface of the metal-based composite material 8, i.e., the size of the conductive plate 82 needs to be set equal to or preferably larger than the wafer's surface to be processed. This is to generate the plasma having a high in-plane uniformity on the surface of the wafer W.

Figure 3A:
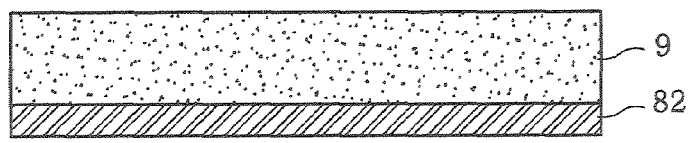
FIGS. 3A to 3D represent explanatory diagrams describing a method for joining a composite material and a conductive plate by using a molten metal when forming the composite material by impregnating the metal into a base member.
Figure 3B:
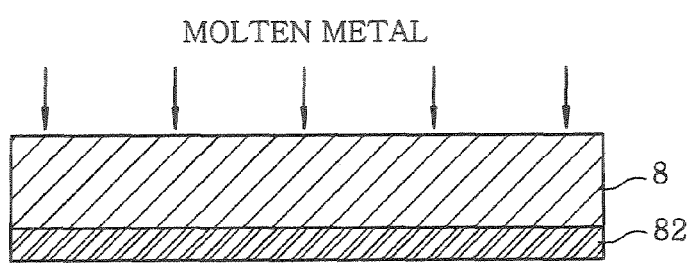
Figure 3C:
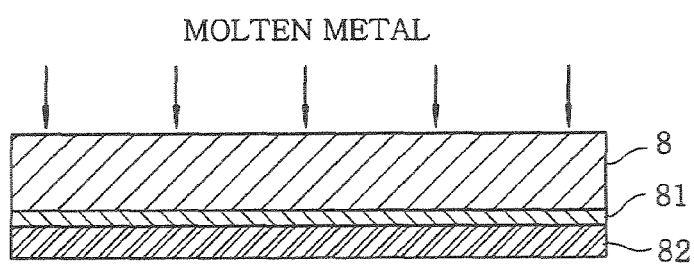
Figure 3D:
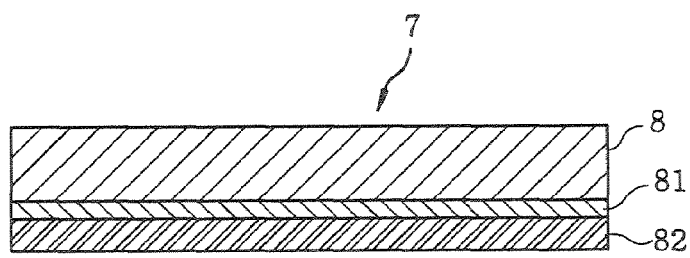

Now, a method for fabricating the upper electrode 7 will be described in detail with reference to FIGS. 3A to 3D. First, as shown in FIG. 3A, the conductive plate 82 made of CVD-silicon carbide (SiC) is stacked on a porous base member 9 made of SiC. Then, as illustrated in FIG. 3B, a molten metal of silicon (Si) is impregnated into the base member 9 by being pressurized by a gas pressure or the like, thereby forming the metal-based composite material 8. Then, as illustrated in FIG. 3C, by constantly pressurizing the molten metal even after the molten metal spread throughout the metal-based composite material 8, the surface (joint surface) of the metal-based composite material 8 and the surface of the conductive plate 82 are joined to each other by the molten metal oozing out from the surface of the metal-based composite material 8, so that the joint layer 81 is formed therebetween. Then, by cooling, the upper electrode 7 shown in FIG. 3D is obtained.

The fabrication method has been described for the case of impregnating the molten metal into the base member 9 by pressurizing the molten metal using the gas pressure or the like (pressurized infiltration method); but is not limited thereto and it is also possible to impregnate the molten metal into the base member 9 by using a capillary phenomenon generated in pores of the base member 9 (natural infiltration method). The metal-based composite material 8 formed by impregnating the molten metal into the base member 9 obtains the same level of conductivity as that of the metal and maintains the same level of strength as that of the base member 9, thereby allowing the metal-based composite material 8 to be utilized as a metal base.

In the above example, the upper electrode 7 is described to be formed by employing SiC, CVD-SiC and silicon as the base member 9, the conductive plate 82 and the molten metal, respectively. However, the combination of the materials for the upper electrode 7 is not limited thereto. Other types of combinations will be described later.

A method for forming gas discharge openings 71 in the upper electrode 7 will be explained hereinafter. By drilling the upper electrode 7 with a cutting tool such as a drill bit, the gas discharge openings 71 each having a diameter of, e.g., 0.5 mm to 1 mm are formed. Since, however, the hardnesses for the metal-based composite material 8, the joint layer 81 and the conductive plate 82 constituting the upper electrode 7 are all different, the drilling needs to be carried out by using different drill bits suitable for the materials. That is, by drilling in the order of the metal-based composite material 8, the joint layer 81 and the conductive plate 82 while changing the drill bits, the gas discharge openings 71 can be formed in the upper electrode 7. Other types of methods for forming the gas discharge openings 71 in the upper electrode 7 will be described later.

Hereinafter, an etching method for etching a film formed on the surface of the wafer W will be explained, where in the etching method is performed by using the plasma etching apparatus configured as described above. First, the gate valve 24 is opened; and the wafer W is loaded into the processing vessel 2 and mounted onto the supporting table 3. Thereafter, the processing vessel 2 is pumped via the gas exhaust port 21 by the vacuum pump 22 until its inner pressure reaches a predetermined vacuum level.

Then, a processing gas including, e.g., a fluorine (F) gas is supplied into the hollow space 73 within the shower head 6 via the gas supply line 74 and the gas inlet port 72, then discharged out through the gas discharge openings 71. Then, while keeping the inner pressure of the processing vessel 2 at a pressure level between 13 and 1333 Pa (between 100 mTorr and 10 Torr), a predetermined high frequency power of, e.g., 100 MHz is applied to the supporting table 3 by the first high frequency power supply 26. The high frequency power propagates to the processing vessel 2 via the conductive plate 82 and the metal-based composite material 8 of the upper electrode 7 and finally flows to the ground, whereby a high frequency electric field is formed in a processing gas atmosphere.

Also, a preset high frequency power of, e.g., 3.2 MHz is supplied from the second high frequency power supply 27 to control the ion energy of the plasma. At this time, as a result of applying a preset voltage to the electrode 34*a* of the electrostatic chuck 34 with the DC power supply 35, the wafer W is adsorbed and held by the electrostatic chuck 34 by, e.g., Coulomb force. In the meanwhile, a high frequency electric field is formed between the upper electrode 7 and the supporting table 3 serving as the lower electrode.

Here, since a horizontal magnetic field is also formed between the shower head 6 and the supporting table 3 due to the presence of the multi-pole ring magnets 25*a* and 25*b*, an orthogonal electromagnetic field is formed in the processing space between the upper and the lower electrode where the wafer W is located. A drifting of electrons produced by the orthogonal electromagnetic field generates a magnetron discharge. The processing gas is then converted into a plasma by the magnetron discharge, and the film formed on the surface of the wafer W is etched by the plasma.

In accordance with the preferred embodiment of the present invention described above, the metal base is formed of the metal-based composite material 8 obtained by impregnating metal silicon (a semiconductor is also treated as a metal in the present invention) into the base member 9 made of SiC which is a porous ceramic. Further, the upper electrode 7 (for plasma generation) is fabricated by melt-bonding the metal-based composite material 8 to the conductive plate 82 formed of CVD-SiC which has a plasma resistance. Accordingly, the metal-based composite material 8 and the conductive plate 82 are bonded to each other uniformly throughout their joint surface.

Figure 4:
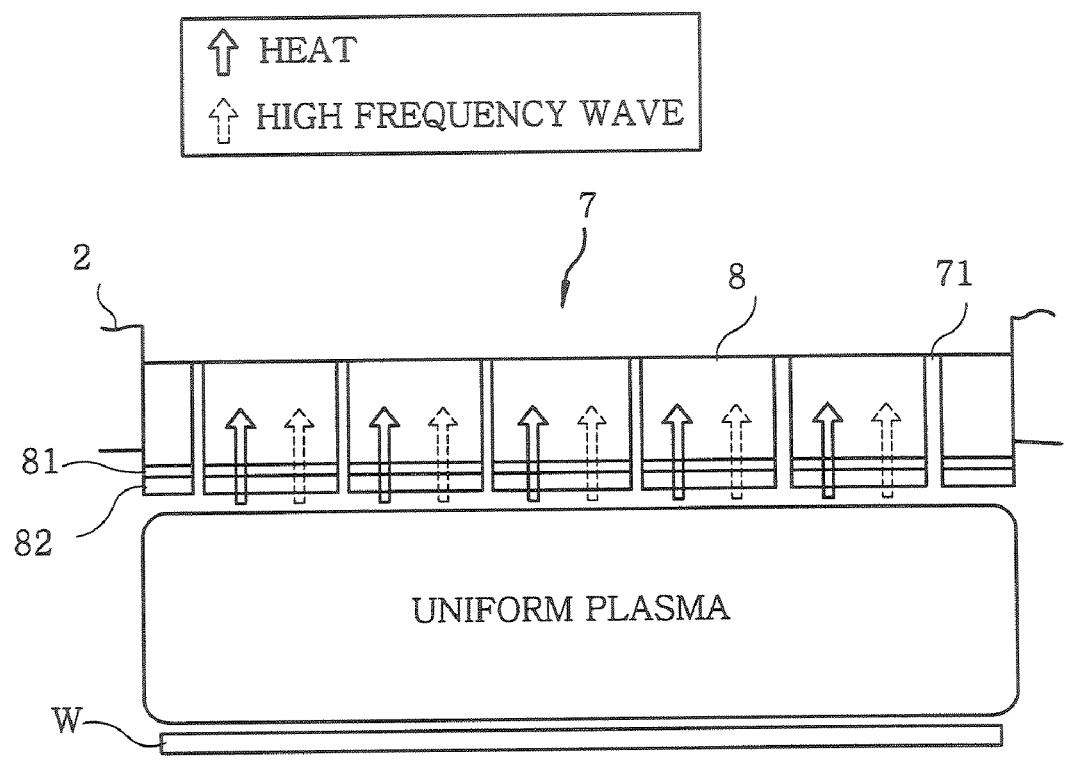
FIG. 4 schematically illustrates conduction of heat and high frequency wave through the upper electrode of the apparatus shown in FIG. 1.

Thus, unlike the case in which the periphery of the conductive plate 82 is fixed by screws, a generation of an excessive local stress due to the difference between the thermally expanded dimensions can be prevented, thereby giving a low possibility of the conductive plate 82 being destroyed. Also, since the joint surface area of the metal-based composite material 8 and the conductive plate 82 is filled with the molten metal (silicon), an electric conduction of high frequency powers and a conduction of heat transferred from the plasma can occur effectively therethrough and also uniformly throughout the entire joint surface as shown in FIG. 4. Further, there can hardly occur a variation between the individual upper electrodes 7.

As a result, the potential and the temperature of the conductive plate 82 can have a high in-plane uniformity; and thus a plasma having a high uniformity in a plane parallel to the wafer W mounted on the supporting table 3 can be generated and a plasma processing can be performed on the entire surface of the wafer W uniformly. Furthermore, since there exists no mechanical contact portion (frictional portion) between the metal-based composite material 8 and the conductive plate 82, no friction occurs therebetween due to thermal expansion and contraction. Therefore, dusts generation can also be prevented.

Moreover, by using SiC as the porous ceramic base member 9 and the conductive plate 82, and by using silicon as the molten metal, a difference in linear expansion coefficients between the metal-based composite material 8 serving as the metal base and the conductive plate 82 can be reduced almost to zero on the joint surface therebetween. As a consequence, a destruction of the conductive plate 82 can certainly be prevented from getting damaged.

Further, in the embodiment described above, silicon nitride ($Si_3N_4$), alumina ($Al_2O_3$), aluminum nitride (AlN), or the like can be employed instead of silicon carbide when forming the base member 9. Also, for forming the conductive plate 82, silicon (Si) or the like can be employed instead of silicon carbide. Furthermore, in lieu of silicon, aluminum (Al) or the like can be used as a molten metal to be impregnated into the base member 9.

Figure 5A:
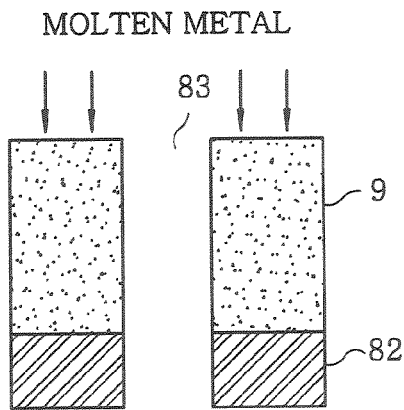
FIGS. 5A to 5C depict explanatory diagrams describing an exemplary method for forming gas discharge openings in the upper electrode.
Figure 5B:
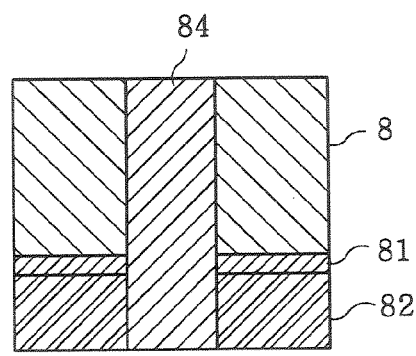
Figure 5C:
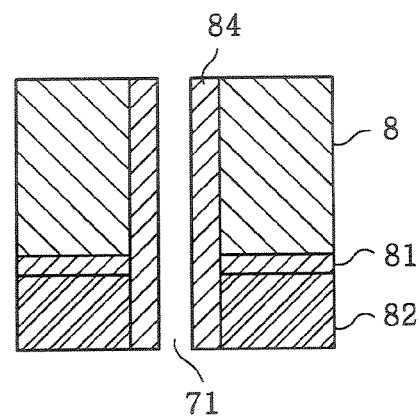

Further, another method for forming gas discharge openings 71 in the upper electrode 7 is described in FIGS. 5A to 5C. First, as shown in FIG. 5A, through holes 83 are formed through the base member 9 and the conductive plate 82 prior to performing the melt-bonding. Then, as illustrated in FIG. 5B, by melt-bonding the base member 9 and the conductive plate 82, the through holes 83 are sealed by a molten metal 84, and by drilling the cooled molten metal 84 filled in the holes 83 with a drill bit thereafter, the gas discharge openings 71 are formed through the cooled molten metal 84 as illustrated in FIG. 5C.

Figure 6A:
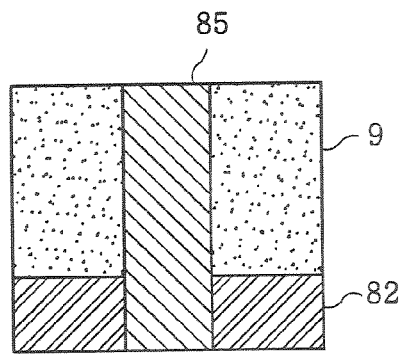
FIGS. 6A to 6C set forth explanatory diagrams describing another exemplary method for forming gas discharge openings in the upper electrode.
Figure 6B:
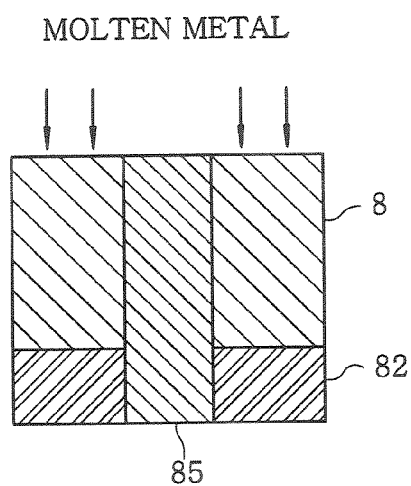
Figure 6C:
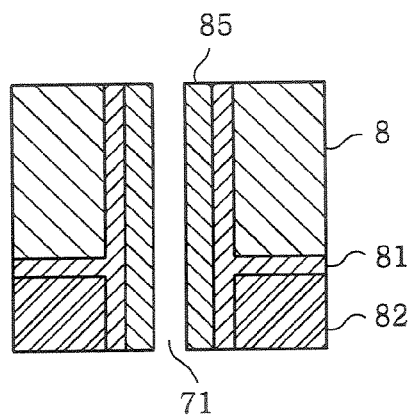
Figure 8:
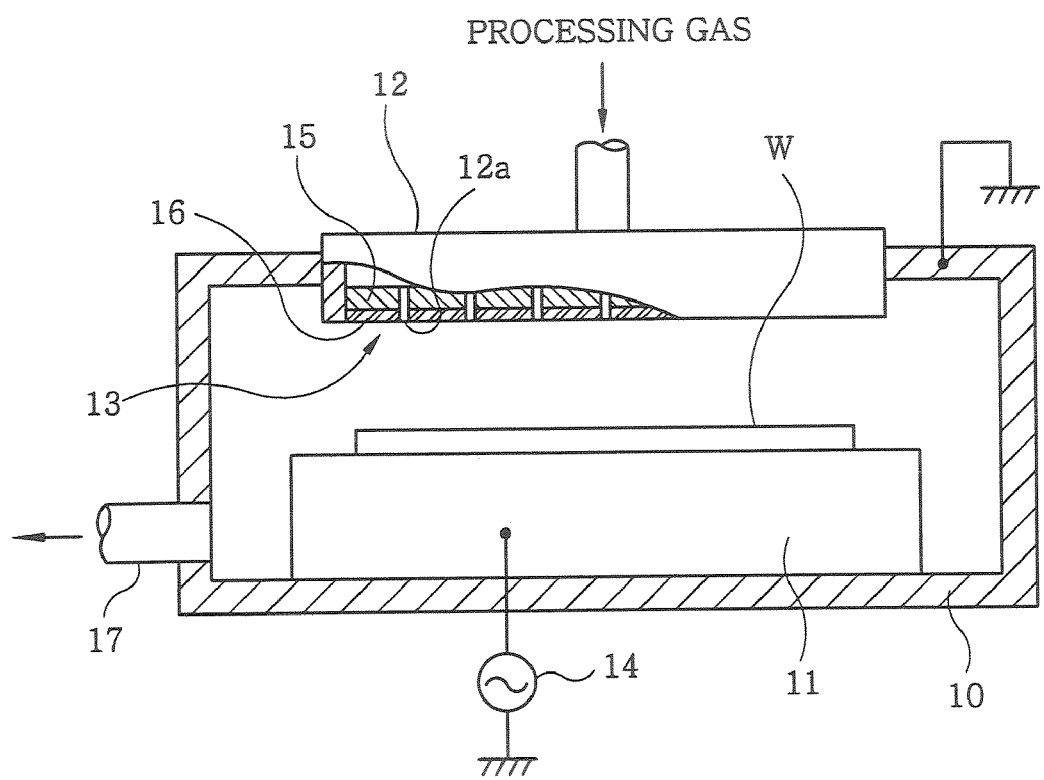
FIG. 8 represents a schematic cross sectional view of a conventional plasma processing apparatus.

Still another method for forming the gas discharge openings 71 is described in FIGS. 6A to 6C. Referring to FIG. 6A, through holes are formed through the base member 9 and the conductive plate 82 prior to the melt-bonding, and rod members 85 are inserted in the through holes. Then, as shown in FIG. 6B, the melt-bonding is performed in this state. By melt-bonding the base member 9, the conductive plate 82 and the rod members 85 are bonded by a molten metal impregnated into the base member 9. Thereafter, as illustrated in FIG. 6C, the rod members 85 bonded to the metal-based composite material 8 and the conductive plate 82 are drilled by a cutting tool, e.g., a drill bit, so that gas discharge openings 71 having a sleeve structure are obtained.

In this method, a brittle material such as silicon carbide (SiC) or yttrium oxide ($Y_2O_3$) is preferably utilized as the rod members (sleeves) 85. Further, desirable combinations of materials for the base member 9, the conductive plate 82 and the molten metal have been searched and the result is provided in FIG. 7. In FIG. 7, a gas hole formation method A refers to the method for forming the gas discharge openings 71 in the upper electrode 7 by drilling the metal-based composite material 8, the junction layer 81 and the conductive plate 82 in this order by changing drill bits, as described in the previous described embodiment of the present invention. Further, a gas hole formation method B refers to the method described in FIGS. 5A to 5C; and a gas hole formation method C refers to the method described in FIGS. 6A to 6C.

Further, still in FIG. 7, materials selected for the base member 9, the conductive plate 82 and the molten metal forming the upper electrode 7 are indicated by circles, and combinations of the materials thereof are defined by P1 to P12. For example, in the combination P2, SiC, Si and Al are selected as materials for the base member 9, the conductive plate 82 and the molten metal, respectively. The combinations are set up not to include aluminum in portions exposed to plasma if possible, for the purpose of preventing metal contaminations. However, in some of combinations in which the conductive plate 82 is formed of silicon, aluminum is used as the molten metal. This is because aluminum has a lower melting point than silicon. In such cases, the possibility of metal contamination owing to the use of aluminum is also extremely low.

As for the sleeve 85, $Al_2O_3$, AlN, $SiO_2$, SiN, $Y_2O_3$, SiC, and so forth can be candidate materials. However, $Al_2O_3$ and AlN cannot be used since they cause metal contamination; $SiO_2$ cannot be used due to its low strength; and SiN is not preferred because of its high cost. Thus, for meeting requirements of low cost and high strength while excluding materials containing aluminium, $Y_2O_3$ and SiC are preferred to be employed as the sleeve materials.

Moreover, when manufacturing the upper electrode 7, it is preferable to select materials for the base member 9 and the conductive plate 82 so as to restrict a dimensional difference therebetween caused by a thermal expansion to be not greater than 30%.

Further, the substrate in the present invention is not limited to the wafer as exemplified in the preferred embodiments described above. For example, the substrate can be a glass substrate or a ceramic substrate for flat panel for use in a liquid crystal display device, a plasma display device, or the like.

While the invention has been shown and described with respect to the preferred embodiments, it will be understood by those skilled in the art that various changes and modification may be made without departing from the scope of the invention as defined in the following claims.

What is claimed is:

1. An electrode for generating a plasma, disposed to face a surface of a substrate to perform a plasma processing on the surface of the substrate, the electrode comprising:
   a metal-based composite material formed by impregnating a metal into a base member made of a porous ceramic, and having a joint surface at least facing toward the entire surface of the substrate; and
   a conductive plate made of a plasma-resistant material melt-bonded by a metal to the joint surface of the metal-based composite material,
   wherein gas discharge openings for discharging a processing gas into a processing atmosphere for the substrate are implemented by sleeves provided through the metal-based composite material and the conductive plate, and boundaries between the metal-based composite material, the sleeves and the conductive plate are melt-bonded by the metal.

2. The electrode of claim 1, wherein the base member is made of silicon carbide, silicon nitride, alumina or aluminum nitride.

3. The electrode of claim 1, wherein the metal used in a melt-bonding process is silicon or aluminum.

4. The electrode of claim 1, wherein the conductive plate is made of silicon or silicon carbide.

5. The electrode of claim 1, wherein the base member is silicon carbide; the metal used in the melt-bonding process is silicon; and the conductive plate is made of silicon carbide.

6. The electrode of claim 5, wherein the conductive plate is made of CVD-silicon carbide.

7. The electrode of claim 1, wherein the conductive plate is melt-bonded to the metal-based composite material by the metal while the metal is impregnated into the base member.

8. The electrode of claim 1, wherein the boundaries between the metal-based composite material, the sleeves and the conductive plate are melt-bonded by the metal while the metal is impregnated into the base member.

9. The electrode of claim 1, wherein the sleeves are made of silicon carbide or yttrium oxide.

10. A plasma processing apparatus comprising the electrode of claim 1 to process the substrate by using the plasma.

11. The plasma processing apparatus of claim 10, comprising:
   a hermetical processing vessel;
   a supporting table disposed in the processing vessel and serving as an electrode member for supporting the substrate thereon;
   a processing gas supply unit for supplying a processing gas into the processing vessel; and
   a plasma generating unit for converting the processing gas into the plasma by forming a high frequency electric field between the supporting table and the electrode facing the supporting table.

* * * * *